(12) United States Patent
Lee et al.

(10) Patent No.: US 11,703,726 B2
(45) Date of Patent: Jul. 18, 2023

(54) DISPLAY DEVICE

(71) Applicant: Samsung Display Co., Ltd., Yongin-si (KR)

(72) Inventors: Jae-Han Lee, Hwaseong-si (KR); Wontae Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/218,517

(22) Filed: Mar. 31, 2021

(65) Prior Publication Data

US 2022/0011617 A1 Jan. 13, 2022

(30) Foreign Application Priority Data

Jul. 10, 2020 (KR) .................. 10-2020-0085603

(51) Int. Cl.
*G02F 1/1345* (2006.01)

(52) U.S. Cl.
CPC ...... *G02F 1/13458* (2013.01); *G02F 1/13452* (2013.01); *G02F 1/13456* (2021.01)

(58) Field of Classification Search
CPC ............. G02F 1/13458; G02F 1/13452; G02F 1/13456
See application file for complete search history.

(56) References Cited

U.S. PATENT DOCUMENTS

| | | | |
|---|---|---|---|
| 7,090,506 B2 * | 8/2006 | Sung | G02F 1/13452 |
| | | | 439/67 |
| 8,289,492 B2 | 10/2012 | Saimen | |
| 10,037,984 B2 * | 7/2018 | Oh | G02F 1/13452 |
| 2019/0245283 A1 | 8/2019 | Oh | |
| 2020/0077518 A1 | 3/2020 | Kim et al. | |

FOREIGN PATENT DOCUMENTS

| | | |
|---|---|---|
| JP | 5359812 B2 | 12/2013 |
| KR | 10-0674020 B1 | 1/2007 |
| KR | 10-1101807 B1 | 1/2012 |
| KR | 10-2019-0096463 A | 8/2019 |
| KR | 10-2023923 B1 | 9/2019 |
| KR | 10-2020-0026369 A | 3/2020 |

* cited by examiner

*Primary Examiner* — Dung T Nguyen
(74) *Attorney, Agent, or Firm* — Lewis Roca Rothgerber Christie LLP

(57) ABSTRACT

A display device includes a display panel including a pixel part to display an image, and a pad part connected to the pixel part; a first flexible circuit film coupled to the pad part and including a first alignment mark; and a second flexible circuit film coupled to the pad part, overlapping the first flexible circuit film, and including a second alignment mark aligned with the first alignment mark. The first and second alignment marks are located in an area where the first flexible circuit film overlaps the second flexible circuit film.

20 Claims, 10 Drawing Sheets

DISPLAY DEVICE

CROSS-REFERENCE TO RELATED APPLICATION

This application claims priority to and the benefit of Korean Patent Application No. 10-2020-0085603, filed on Jul. 10, 2020 in the Korean Intellectual Property Office, the entire content of which is hereby incorporated by reference.

BACKGROUND

1. Field

Aspects of embodiments of the present disclosure relate to a display device.

2. Description of the Related Art

Various types of display devices are being used to provide image information, and the display devices include a display panel displaying images and a flexible circuit film coupled to the display panel to apply driving signals to the display panel. The display panel includes a display area to display the images, and panel pads are arranged outside the display area to apply the driving signals to a display unit displaying the images. The panel pads are electrically connected to the flexible circuit film and receive the driving signals through the flexible circuit film.

The flexible circuit film includes film pads arranged thereon to correspond to the panel pads. In recent years, as the display device becomes larger in size, a plurality of flexible circuit films is coupled to the display panel. In addition, two or more flexible circuit films overlap each other while being coupled to the display panel. In this case, a misalignment may occur between the film pads and the panel pads and between the flexible circuit films that overlap each other.

SUMMARY

According to an aspect of one or more embodiments, a display device is provided in which a misalignment may be prevented or substantially prevented from occurring between flexible circuit films overlapping each other and coupled to a display panel.

According to one or more embodiments, a display device includes: a display panel including a pixel part to display an image, and a pad part connected to the pixel part; a first flexible circuit film coupled to the pad part and including a first alignment mark; and a second flexible circuit film coupled to the pad part, overlapping the first flexible circuit film, and including a second alignment mark aligned with the first alignment mark. The first and second alignment marks are located in an area where the first flexible circuit film overlaps the second flexible circuit film.

In one or more embodiments, the pad part includes a first pad part and a second pad part between the pixel part and the first pad part, the first flexible circuit film is coupled to the first pad part, and the second flexible circuit film is coupled to the second pad part.

In one or more embodiments, the first flexible circuit film includes a first base film, a first conductive line on the first base film and electrically connected to the first pad part, and a first cover layer covering the first conductive line and comprising a first opening defined therethrough. The second flexible circuit film includes a second base film, a second conductive line on the second base film and electrically connected to the second pad part, and a second cover layer covering the second conductive line and comprising a second opening defined therethrough.

In one or more embodiments, the first alignment mark is located on the first base film and exposed through the first opening, and the second alignment mark is located on the second base film and exposed through the second opening.

In one or more embodiments, the first alignment mark is located on a same layer as the first conductive line, and the second alignment mark is located on a same layer as the second conductive line.

In one or more embodiments, the first opening overlaps the second alignment mark, and the second opening overlaps the first alignment mark.

In one or more embodiments, at least a portion of the first opening is not surrounded by the first cover layer, and at least a portion of the second opening is not surrounded by the second cover layer.

In one or more embodiments, the first and second openings do not overlap the display panel.

In one or more embodiments, the pad part further includes a third pad part electrically connected to the first and second flexible circuit films.

In one or more embodiments, the first pad part extends in a first direction, and the second pad part extends in the first direction and is spaced apart from the first pad part in a second direction different from the first direction.

In one or more embodiments, a width in the first direction of the first flexible circuit film is the same as a width in the first direction of the second flexible circuit film.

In one or more embodiments, a width in the second direction of the first flexible circuit film is smaller than a width in the second direction of the second flexible circuit film.

In one or more embodiments, the display device further includes a third flexible circuit film coupled to the pad part, overlapping the first and second flexible circuit films, and including a third alignment mark aligned with the first and second alignment marks, and the third alignment mark is located in an area where the first, second, and third flexible circuit films overlap each other.

In one or more embodiments, the display device further includes a first driving chip mounted on the first flexible circuit film and a second driving chip mounted on the second flexible circuit film.

In one or more embodiments, the first driving chip does not overlap the second driving chip.

In one or more embodiments, the display panel further includes a first panel alignment mark and a second panel alignment mark. The first flexible circuit film further includes a third alignment mark aligned with the first panel alignment mark, and the second flexible circuit film further includes a fourth alignment mark aligned with the second panel alignment mark.

According to one or more embodiments, a display device includes: a display panel including a pixel part to display an image, a first pad part connected to the pixel part, and a second pad part connected to the pixel part and located between the first pad part and the pixel part, a first flexible circuit film coupled to the first pad part and including a first alignment mark, and a second flexible circuit film coupled to the second pad part, overlapping the first flexible circuit film, and including a second alignment mark aligned with the first alignment mark. The first and second alignment marks are located in an area where the first flexible circuit film overlaps the second flexible circuit film, and the first and second alignment marks do not overlap the display panel.

In one or more embodiments, the first flexible circuit film includes a first base film, a first conductive line on the first base film and electrically connected to the first pad part, and a first cover layer covering the first conductive line and comprising a first opening defined therethrough. The second flexible circuit film includes a second base film, a second conductive line on the second base film and electrically connected to the second pad part, and a second cover layer covering the second conductive line and comprising a second opening defined therethrough.

In one or more embodiments, the first alignment mark is on the first base film and exposed through the first opening, and the second alignment mark is on the second base film and exposed through the second opening.

In one or more embodiments, the first opening overlaps the second alignment mark, and the second opening overlaps the first alignment mark.

According to an aspect of one or more embodiments, the alignment marks to align the flexible circuit films that overlap each other and are coupled to the display panel may be provided in the flexible circuit films instead of the display panel. Thus, an increase in size of the flexible circuit films, which is required to align the display panel and the flexible circuit films when the alignment marks are provided in the display panel, may be prevented or substantially prevented. Accordingly, a process margin may be secured in a process of manufacturing the display device, and a productivity thereof may be improved.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
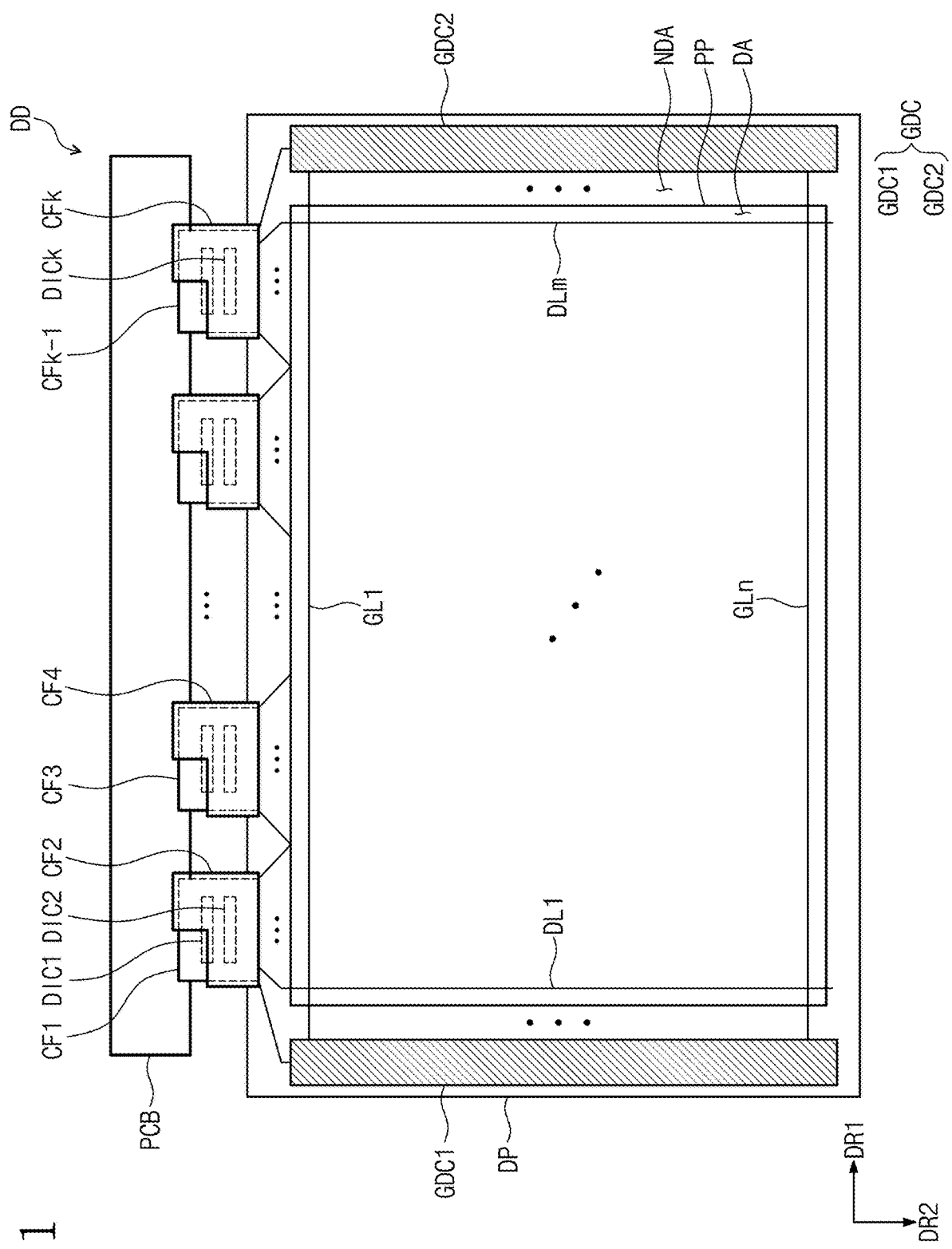
FIG. 1 is a plan view showing a display device according to an embodiment of the present disclosure.

The present invention will be described more fully herein with reference to the accompanying drawings, in which some embodiments are shown. The present invention may, however, be embodied in many different forms, and should not be construed as limited to the embodiments set forth herein.

In the present disclosure, it is to be understood that when an element or layer is referred to as being "on," "connected to," or "coupled to" another element or layer, it may be directly on, connected, or coupled to the other element or layer, or one or more intervening elements or layers may be present.

Like numerals refer to like elements throughout. In the drawings, the thicknesses, ratios, and dimensions of components may be exaggerated for purposes of description of the technical content.

As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element or feature as illustrated in the figures.

Unless otherwise defined, all terms including technical and scientific terms used herein have the same meaning as commonly understood by one of ordinary skill in the art to which this disclosure belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

It is to be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Herein, the present disclosure will be explained in further detail with reference to the accompanying drawings.

Figure 2:
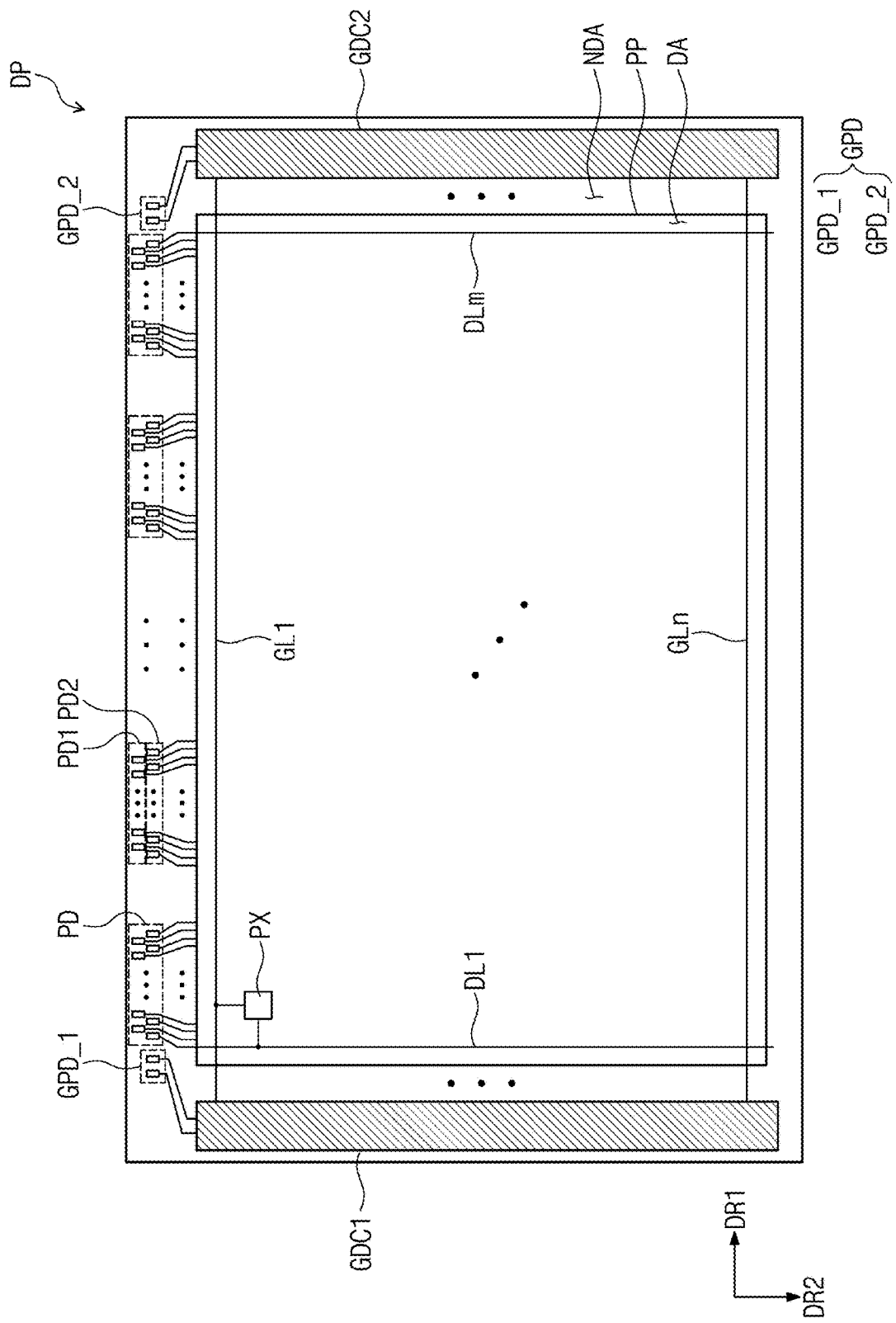
FIG. 2 is a plan view showing a display panel according to an embodiment of the present disclosure.
Figure 3:
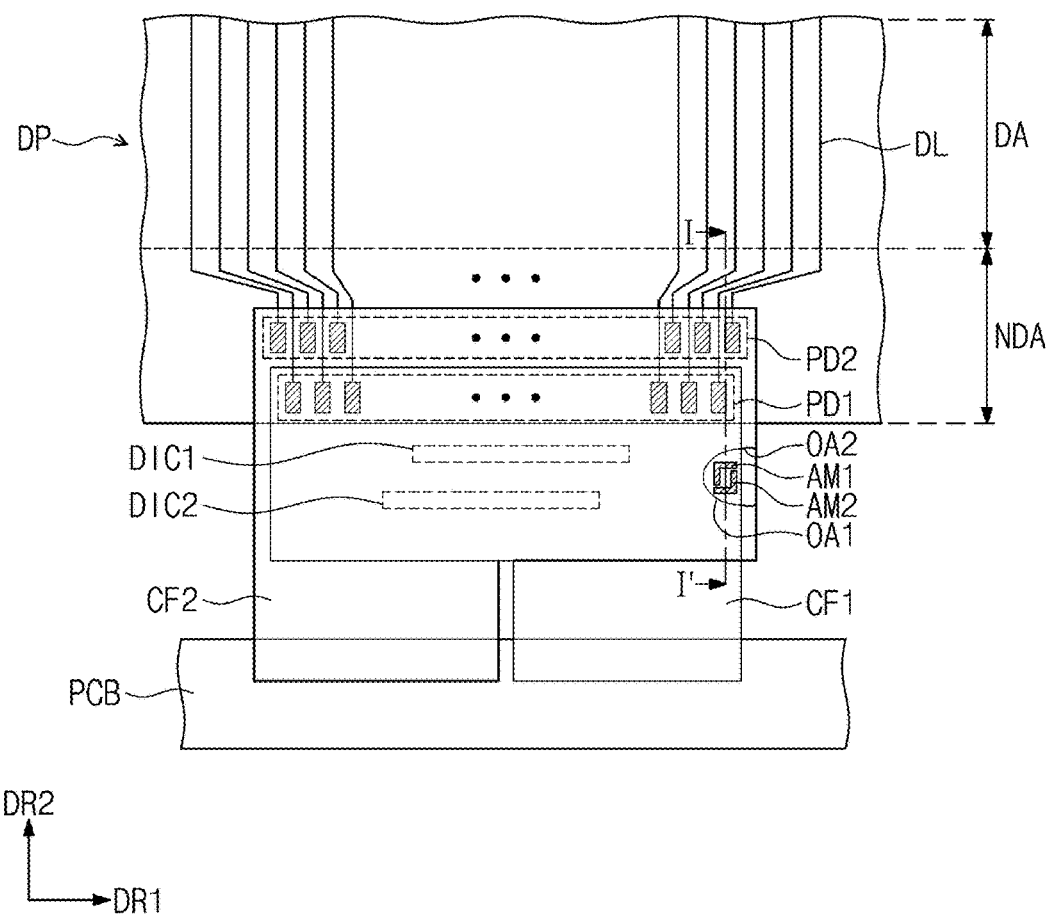
FIG. 3 is an enlarged plan view showing a portion of a display device according to an embodiment of the present disclosure.
Figure 4:
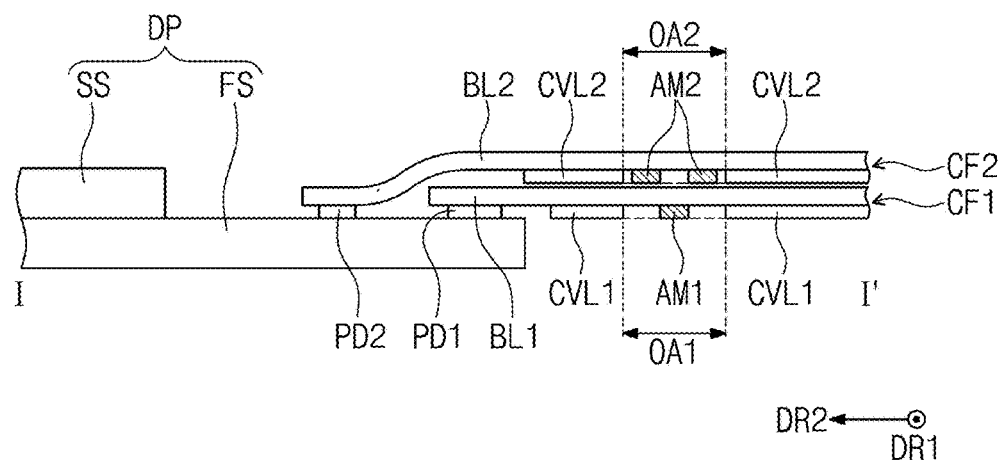
FIG. 4 is a cross-sectional view taken along the line I-I' shown in FIG. 3.

FIG. 1 is a plan view showing a display device DD according to an embodiment of the present disclosure; FIG. 2 is a plan view showing a display panel DP according to an embodiment of the present disclosure; FIG. 3 is an enlarged plan view showing a portion of the display device DD according to an embodiment of the present disclosure; and FIG. 4 is a cross-sectional view taken along the line I-I' shown in FIG. 3.

Referring to FIGS. 1 and 2, in an embodiment, the display device DD may have a rectangular shape with long sides extending in a first direction DR1 and short sides extending in a second direction DR2 crossing the first direction DR1. In this case, the second direction DR2 may be substantially perpendicular to the first direction DR1. However, the shape of the display device DD is not limited thereto or thereby, and the display device DD may have any of a variety of shapes. The display device DD may be a large-sized display device, such as a television set, a monitor, or the like, or a small- or medium-sized display device, such as a mobile phone, a tablet computer, a car navigation unit, a game unit, or the like. However, these are merely examples, and the display device DD may be employed in other electronic items as long as it does not depart from the inventive concept of the present disclosure.

Referring to FIGS. 1 and 2, the display device DD may include the display panel DP to display an image, and a panel driver driving the display panel DP. As an example, the panel driver may include a gate driver GDC and a data driver.

The display panel DP may include a display area DA displaying the image and a non-display area NDA defined around the display area DA. The display area DA may be an area in which the image is displayed, and the non-display area NDA may be a bezel area in which the image is not displayed. FIG. 1 shows a structure in which the non-display area NDA is defined to surround the display area DA; however, the present disclosure is not limited thereto or thereby. In an embodiment, for example, the non-display area NDA may be defined adjacent to only one side of the display area DA.

The display panel DP may include a plurality of gate lines GL1 to GLn, a plurality of data lines DL1 to DLm, and a plurality of pixels PX. The gate lines GL1 to GLn may extend in the first direction DR1 and may be arranged in the second direction DR2 to be substantially parallel to each other. As an example, the second direction DR2 may be substantially perpendicular to the first direction DR1. The data lines DL1 to DLm may be arranged in the first direction DR1 to be substantially parallel to each other and may extend in the second direction DR2.

The pixels PX may be arranged in the first and second directions DR1 and DR2 in the display area DA. As an example, the pixels PX may be arranged in a matrix form. Each of the pixels PX may be electrically connected to one of the gate lines GL1 to GLn and one of the data lines DL1 to DLm. Each pixel may be turned on in response to a gate signal applied thereto through a corresponding gate line and may receive a data voltage through a corresponding data line to display an image having a desired grayscale.

The gate driver GDC may sequentially output gate signals to the gate lines GL1 to GLn. Accordingly, the pixels PX may be sequentially scanned in the unit of rows by the gate signals. As an example, the gate driver GDC may include a first gate driver GDC1 and a second gate driver GDC2. The first gate driver GDC1 may be electrically connected to first ends of the gate lines GL1 to GLn, and the second gate driver GDC2 may be electrically connected to second ends of the gate lines GL1 to GLn. Each of the first and second gate drivers GDC1 and GDC2 may include a shift register that sequentially outputs the gate signals. The first and second gate drivers GDC1 and GDC2 may be substantially concurrently (e.g., substantially simultaneously) turned on and may substantially concurrently (e.g., substantially simultaneously) output the gate signals to the same gate line. Accordingly, each of the gate lines GL1 to GLn may receive the gate signals from the first and second gate drivers GDC1 and GDC2 through opposite ends thereof.

FIGS. 1 and 2 show a structure in which two gate drivers GDC1 and GDC2 are electrically connected to opposite ends of the gate lines GL1 to GLn, respectively; however, the present disclosure is not limited thereto or thereby. That is, in an embodiment, the display device DD may employ a structure in which only one of the first and second gate drivers GDC1 and GDC2 is electrically connected to the gate lines GL1 to GLn.

The first and second gate drivers GDC1 and GDC2 may be built in the display panel DP. That is, in an embodiment, the first and second gate drivers GDC1 and GDC2 may be formed in the non-display area NDA of the display panel DP through a thin film process performed to form the pixels PX in the display area DA of the display panel DP.

The data driver may convert image signals to data voltages and may apply the data voltages to the data lines DL1 to DLm of the display panel DP. In an embodiment, the data driver may include a plurality of driving chips DIC1 to DICk. Each of the driving chips DIC1 to DICk is electrically connected to corresponding data lines among the data lines DL1 to DLm. FIG. 1 shows k driving chips DIC1 to DICk; however, the number of the driving chips DIC1 to DICk is not particularly limited.

The display device DD may further include a plurality of flexible circuit films CF1 to CFk and a printed circuit board PCB. The flexible circuit films CF1 to CFk may be provided between the display panel DP and the printed circuit board PCB and may electrically connect the display panel DP and the printed circuit board PCB. One end of each of the flexible circuit films CF1 to CFk may be coupled to the display panel DP, and the other end of each of the flexible circuit films CF1 to CFk may be coupled to the printed circuit board PCB.

FIG. 1 shows a structure in which the driving chips DIC1 to DICk are respectively mounted on the flexible circuit films CF1 to CFk; however, the present disclosure is not limited thereto or thereby. That is, in an embodiment, the driving chips DIC1 to DICk may be mounted directly on the display panel DP by a chip-on-glass COG method.

Various circuits generating a variety of control signals and a power signal that drive the display panel DP and the panel driver may be arranged on the printed circuit board PCB.

The display panel DP may further include a plurality of pad parts PD and a gate pad part GPD. The pad parts PD and the gate pad part GPD may be disposed in the non-display area NDA. The pad parts PD may include a plurality of data pads electrically connected to the data lines DL1 to DLm. The pad parts PD may be arranged in the first direction DR1 to be spaced apart from each other. The pad parts PD may be coupled to the flexible circuit films CF1 to CFk and may receive the data voltages from the driving chips DIC1 to DICk mounted on the flexible circuit films CF1 to CFk.

In an embodiment, the gate pad part GPD may include a first gate pad part GPD_1 electrically connected to the first gate driver GDC1 and a second gate pad part GPD_2 electrically connected to the second gate driver GDC2. The first gate pad part GPD_1 may include a plurality of gate pads to provide a first gate driving signal to the first gate driver GDC1, and the second gate pad part GPD_2 may include a plurality of gate pads to provide a second gate driving signal to the second gate driver GDC2.

The gate pad part GPD may be connected to some of the flexible circuit films CF1 to CFk. As an example, the first gate pad part GPD_1 may be connected to a first flexible circuit film CF1 among the flexible circuit films CF1 to CFk, and the second gate pad part GPD_2 may be connected to a k-th flexible circuit film CFk among the flexible circuit films CF1 to CFk. The first gate driving signal may be a signal output from a first driving chip DIC1 mounted on the first flexible circuit film CF1 or a signal provided from the printed circuit board PCB. The second gate driving signal may be a signal output from the k-th driving chip DICk mounted on the k-th flexible circuit film CFk or a signal provided from the printed circuit board PCB.

Although not shown in figures, in an embodiment, the display device DD may further include a backlight unit that provides a light to the display panel DP. When the display panel DP is a liquid crystal display panel that does not emit the light by itself, the backlight unit may be disposed at a rear side of the liquid crystal display panel and may provide the light to the liquid crystal display panel. Each pixel may control a transmittance of the light provided from the backlight unit and may display the image having the desired grayscale.

Referring to FIGS. 1 to 4, one end of each of the flexible circuit films CF1 to CFk may be coupled to the display panel DP, and the other end of each of the flexible circuit films CF1 to CFk may be coupled to the printed circuit board PCB.

As an example, the display panel DP may have a quadrangular shape when viewed in a plane. The flexible circuit films CF1 to CFk may be coupled to one side of the display panel DP.

The display panel DP may include a first display substrate FS and a second display substrate SS. The first display substrate FS may include a first base substrate and a pixel part PP disposed on the first base substrate. The pixel part PP may include a thin film transistor, a pixel electrode, and a plurality of insulating layers to form each pixel PX. The pixel part PP may be disposed to correspond to the display area DA of the display panel DP. The first and second gate drivers GDC1 and GDC2 may be disposed on the first base substrate to correspond to the non-display area NDA. The second display substrate SS may include a second base substrate and a reference electrode. The first display substrate FS may be disposed to face the second display substrate SS.

In an embodiment, the display panel DP may further include a sealant disposed in the non-display area NDA to couple the first and second display substrates FS and SS. A space between the first and second display substrates FS and SS may be sealed by the sealant. The first and second gate drivers GDC1 and GDC2 may overlap the sealant.

Some of the flexible circuit films CF1 to CFk may be coupled to the display panel DP and may overlap each other. As an example, the pad parts PD may include a first pad part PD1 and a second pad part PD2 disposed between the pixel part PP and the first pad part PD1. The flexible circuit films CF1 to CFk may include flexible circuit films CF1, CF3, . . . CFk−1 connected to the first pad part PD1 and flexible circuit films CF2, CF4, . . . CFk connected to the second pad part PD2. As an example, the first flexible circuit film CF1 may be coupled to the first pad part PD1, and the second flexible circuit film CF2 may overlap the first flexible circuit film CF1 and may be coupled to the second pad part PD2. The first flexible circuit film CF1 and the second flexible circuit film CF2 may overlap each other.

Particularly, the flexible circuit films CF1 to CFk may be coupled to the first display substrate FS of the display panel DP. The first display substrate FS may have a structure extending more than the second display substrate SS to be coupled to the flexible circuit films CF1 to CFk. The first and second pad parts PD1 and PD2 may be disposed on the first display substrate FS and may be exposed without being covered by the second display substrate SS.

The flexible circuit films CF1 to CFk may be arranged in the first direction DR1 to be spaced apart from each other. Each of the driving chips DIC1 to DICk may have a structure that extends in the first direction DR1. Each of the flexible circuit films CF1 to CFk may be bent to allow the printed circuit board PCB to be disposed on a rear surface of the display panel DP.

As an example, the first pad part PD1 may extend in the first direction DR1, and the second pad part PD2 may extend in the first direction DR1 and may be spaced apart from the first pad part PD1 in the second direction DR2 different from the first direction DR1.

As an example, the flexible circuit films CF1 to CFk may include a material having flexibility. Among the driving chips DIC1 to DICk, a corresponding driving chip may be mounted on each of the flexible circuit films CF1 to CFk. For example, the first driving chip DIC1 may be mounted on the first flexible circuit film CF1, and a second driving chip DIC2 may be mounted on the second flexible circuit film CF2. The first driving chip DIC1 may be disposed between one end and the other end of the first flexible circuit film CF1, and the second driving chip DIC2 may be disposed between one end and the other end of the second flexible circuit film CF2. As an example, the first driving chip DIC1 and the second driving chip DIC2 may not overlap each other in a plane.

As an example, the first flexible circuit film CF1 may include a first base film BL1, a first conductive line CL1 (refer to FIG. 5A) disposed on the first base film BL1, and a first cover layer CVL1 covering the first conductive line CL1. The second flexible circuit film CF2 may include a second base film BL2, a second conductive line CL2 (refer to FIG. 5B) disposed on the second base film BL2, and a second cover layer CVL2 covering the second conductive line CL2.

In an embodiment, the first and second base films BL1 and BL2 may include a polymer material, e.g., polyimide, polyester, or the like. The first and second base films BL1 and BL2 may have flexibility.

In an embodiment, the first and second cover layers CVL1, CVL2 may include a solder-resist material.

In an embodiment, the first flexible circuit film CF1 may include a first alignment mark AM1, and the second flexible circuit film CF2 may include a second alignment mark AM2 aligned with the first alignment mark AM1. The first alignment mark AM1 and the second alignment mark AM2 may be provided in an area where the first and second flexible circuit films CF1 and CF2 overlap each other. FIG. 3 shows the first alignment mark AM1 having an L-shape and the second alignment mark AM2 having an L-shape inverted by 180 degrees as a representative example. However, the shapes of the first and second alignment marks AM1 and AM2 are not limited thereto or thereby and may have any of a variety of shapes that may be aligned with each other.

Figure 5A:
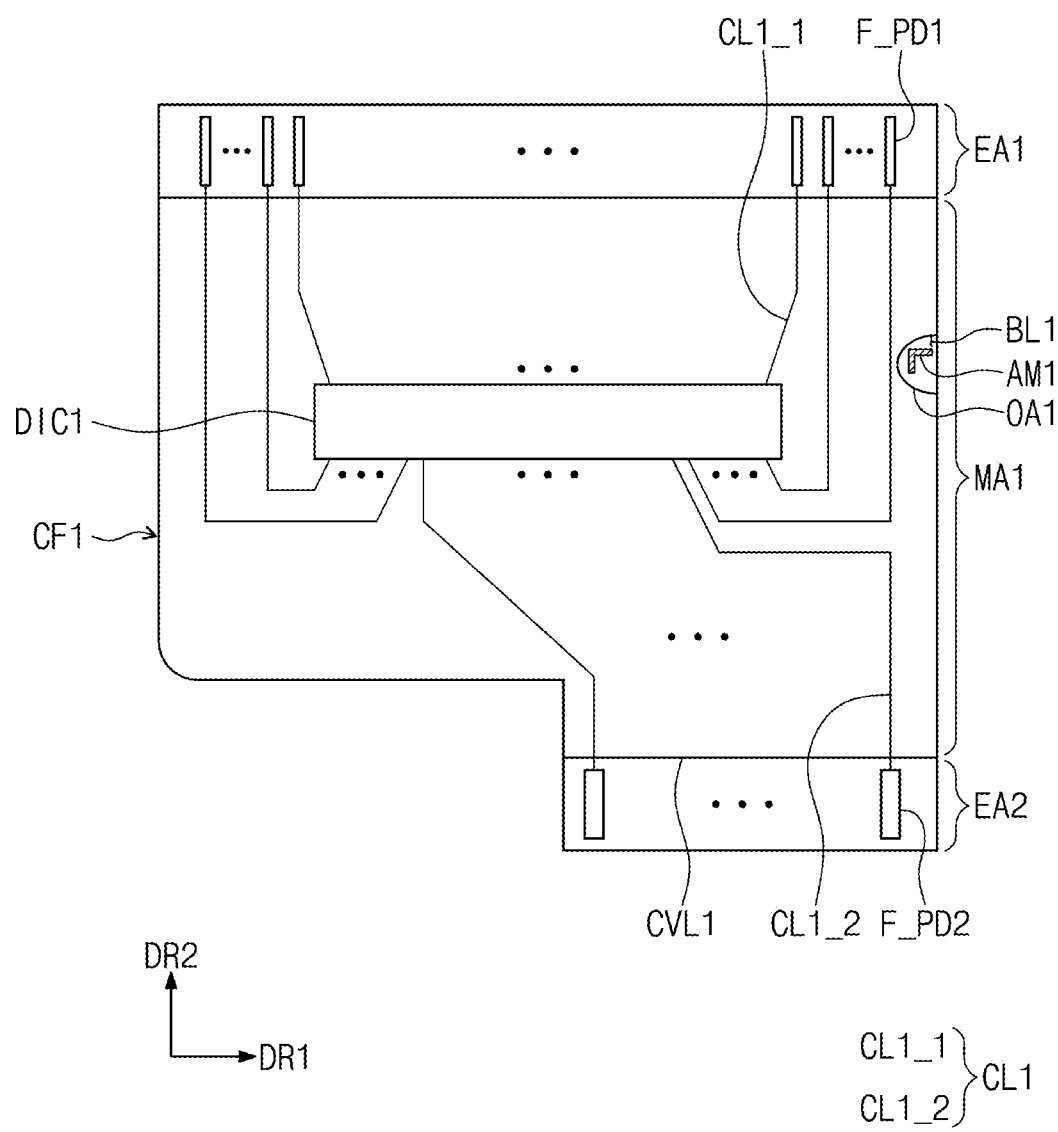
FIG. 5A is a plan view showing a first flexible circuit film according to an embodiment of the present disclosure.
Figure 5B:
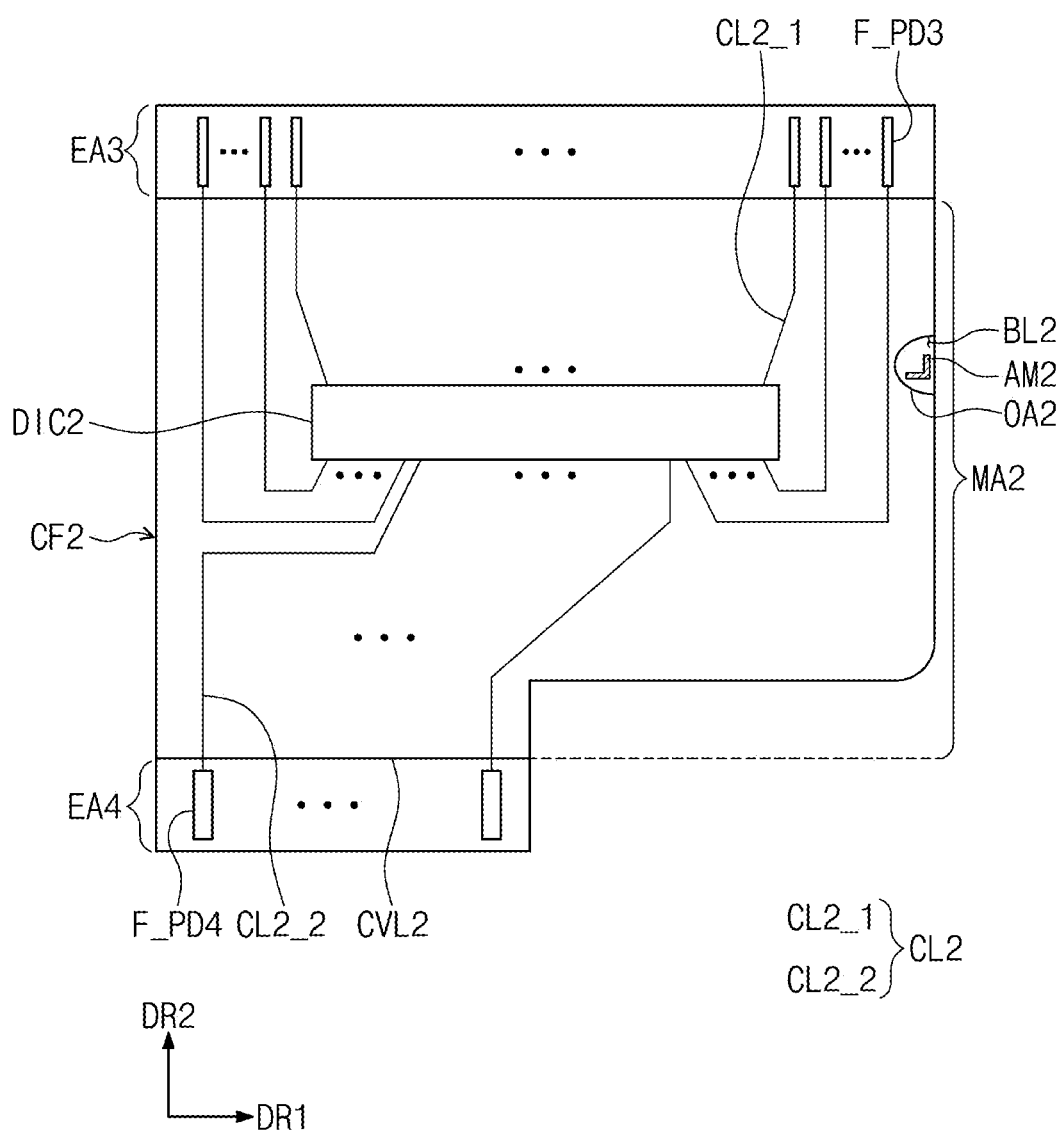
FIG. 5B is a plan view showing a second flexible circuit film according to an embodiment of the present disclosure.

FIG. 5A is a plan view showing a first flexible circuit film according to an embodiment of the present disclosure; and FIG. 5B is a plan view showing a second flexible circuit film according to an embodiment of the present disclosure.

Referring to FIGS. 3, 4, 5A, and 5B, the first cover layer CVL1 of the first flexible circuit film CF1 may further include a first opening OA1 defined therethrough, and the second cover layer CVL2 of the second flexible circuit film CF2 may further include a second opening OA2 defined therethrough. As an example, the first alignment mark AM1 included in the first flexible circuit film CF1 may be disposed on the first base film BL1, and the first alignment mark AM1 may be exposed through the first opening OA1. The second alignment mark AM2 included in the second flexible circuit film CF2 may be disposed on the second base film BL2, and the second alignment mark AM2 may be exposed through the second opening OA2. In an embodiment, the first alignment mark AM1 may be disposed on a same layer as the first conductive line CL1, and the second alignment mark AM2 may be disposed on a same layer as the second conductive line CL2. When the first conductive line CL1 is disposed on a first surface of the first base film BL1, the first alignment mark AM1 may be disposed on the first surface of the first base film BL1. When the second conductive line CL2 is disposed on a first surface of the second base film BL2, the second alignment mark AM2 may be disposed on the first surface of the second base film BL2. However, the present disclosure is not limited thereto or thereby. In an embodiment, the first alignment mark AM1 may be disposed on a surface opposite to the first surface of the first base film BL1, and the second alignment mark AM2 may be disposed on a surface opposite to the first surface of the second base film BL2.

The first opening OA1 may expose the first alignment mark AM1 and may be formed in an area overlapping the second alignment mark AM2. The second opening OA2 may expose the second alignment mark AM2 and may be formed in an area overlapping the first alignment mark AM1. Accordingly, when the flexible circuit films CF1 to CFk are coupled to the display panel DP, an increase in area of the flexible circuit films CF1 to CFk, which is for the alignment of the flexible circuit films CF1 to CFk, may be prevented or substantially prevented, and, thus, a process margin may be secured. As an example, when the first and second flexible circuit films CF1 and CF2 are coupled to the display panel DP, it is possible to check whether the first and second flexible circuit films CF1 and CF2 are aligned with each other through a camera (not shown). In further detail, the first and second alignment marks AM1 and AM2 disposed on the first and second base films BL1 and BL2 of the first and second flexible circuit films CF1 and CF2 may be checked using the camera through the first and second openings OA1 and OA2 formed on the first and second cover layers CVL1 and CVL2.

When the first and second flexible circuit films CF1 and CF2 are coupled to the display panel DP, alignment marks may be respectively disposed on the display panel DP and the first and second flexible circuit films CF1 and CF2 and may align the display panel DP with the first and second flexible circuit films CF1 and CF2 to increase coupling reliability between the first and second pad parts PD1 and PD2 and first and third conductive pads F_PD1 and F_PD3. In this case, when the first and second flexible circuit films CF1 and CF2 overlapping each other are coupled to the display panel DP, the alignment between the first and second flexible circuit films CF1 and CF2 is needed to increase coupling reliability between the first and second flexible circuit films CF1 and CF2 and the printed circuit board PCB.

In a conventional display device, a first additional alignment mark may be disposed on the display panel DP for alignment between the first and second flexible circuit films CF1 and CF2. Accordingly, an increase in area of the second flexible circuit film CF2 is required to dispose a second additional alignment mark that is aligned with the first additional alignment mark.

However, according to embodiments of the present disclosure, a first additional alignment mark on the display panel DP for the alignment of the first and second flexible circuit films CF1 and CF2 is not needed, and the area of the second flexible circuit film CF2 for the disposition of the second additional alignment mark aligned with the first additional alignment mark is not increased. Accordingly, a gap between the flexible circuit films CF arranged in a first direction and coupled to the display panel DP may be additionally secured, a margin of the coupling process between the display panel DP and the flexible circuit films CF may be secured, and, thus, the reliability of the display device DD may be improved.

Referring to FIGS. 5A and 5B, the first flexible circuit film CF1 may include a first center area MA1, a first pad area EA1 defined at one side with respect to the first center area MA1, and a second pad area EA2 defined at the other side with respect to the first center area MA1. The first driving chip DIC1 may be mounted on the first center area MA1 of the first flexible circuit film CF1.

The second flexible circuit film CF2 may include a second center area MA2, a third pad area EA3 defined at one side with respect to the second center area MA2, and a fourth pad area EA4 defined at the other side with respect to the second center area MA2. The second driving chip DIC2 may be mounted on the second center area MA2 of the second flexible circuit film CF2.

The first conductive line CL1 may include first sub-conductive lines CL1_1 and second sub-conductive lines CL1_2. The first sub-conductive lines CL1_1 and the second sub-conductive lines CL1_2 may be electrically connected to the first driving chip DIC1 in the first center area MA1.

The second conductive line CL2 may include third sub-conductive lines CL2_1 and fourth sub-conductive lines CL2_2. The third sub-conductive lines CL2_1 and the fourth sub-conductive lines CL2_2 may be electrically connected to the second driving chip DIC2 in the second center area MA2.

The first flexible circuit film CF1 may further include first conductive pads F_PD1 extending from the first sub-conductive lines CL1_1 and second conductive pads F_PD2 extending from the second sub-conductive lines CL1_2. The first conductive pads F_PD1 may be disposed on the first pad area EA1 of the first base film BL1, and the second conductive pads F_PD2 may be disposed on the second pad area EA2 of the first base film BL1. The first conductive pads F_PD1 may be electrically connected to the first pad part PD1 of the display panel DP, and the second conductive pads F_PD2 may be electrically connected to the pad part of the printed circuit board PCB.

The second flexible circuit film CF2 may further include third conductive pads F_PD3 extending from the third sub-conductive lines CL2_1 and fourth conductive pads F_PD4 extending from the fourth sub-conductive lines CL2_2. The third conductive pads F_PD3 may be disposed on the third pad area EA3 of the second base film BL2, and the fourth conductive pads F_PD4 may be disposed on the fourth pad area EA4 of the second base film BL2. The third conductive pads F_PD3 may be electrically connected to the second pad part PD2 of the display panel DP, and the fourth conductive pads F_PD4 may be electrically connected to the pad part of the printed circuit board PCB.

The first flexible circuit film CF1 may further include the first cover layer CVL1 disposed in the first center area MA1 to cover the first sub-conductive lines CL1_1 and the second sub-conductive lines CL1_2. The first cover layer CVL1 may not be disposed in the first and second pad areas EA1 and EA2. Accordingly, the first and second conductive pads F_PD1 and F_PD2 may be exposed without being covered by the first cover layer CVL1. In addition, the first cover layer CVL1 may be provided with the first opening OA1 through which the first alignment mark AM1 is exposed. The first base film BL1 may be exposed through the first opening OA1.

The second flexible circuit film CF2 may further include the second cover layer CVL2 disposed in the second center area MA2 to cover the third sub-conductive lines CL2_1 and the fourth sub-conductive lines CL2_2. The second cover layer CVL2 may not be disposed in the third and fourth pad areas EA3 and EA4. Accordingly, the third and fourth conductive pads F_PD3 and F_PD4 may be exposed without being covered by the second cover layer CVL2. In addition, the second cover layer CVL2 may be provided with the second opening OA2 through which the second alignment mark AM2 is exposed. The second base film BL2 may be exposed through the second opening OA2. In an embodiment, the first and second cover layers CVL1 and CVL2 may be a solder-resist material.

Figure 6:
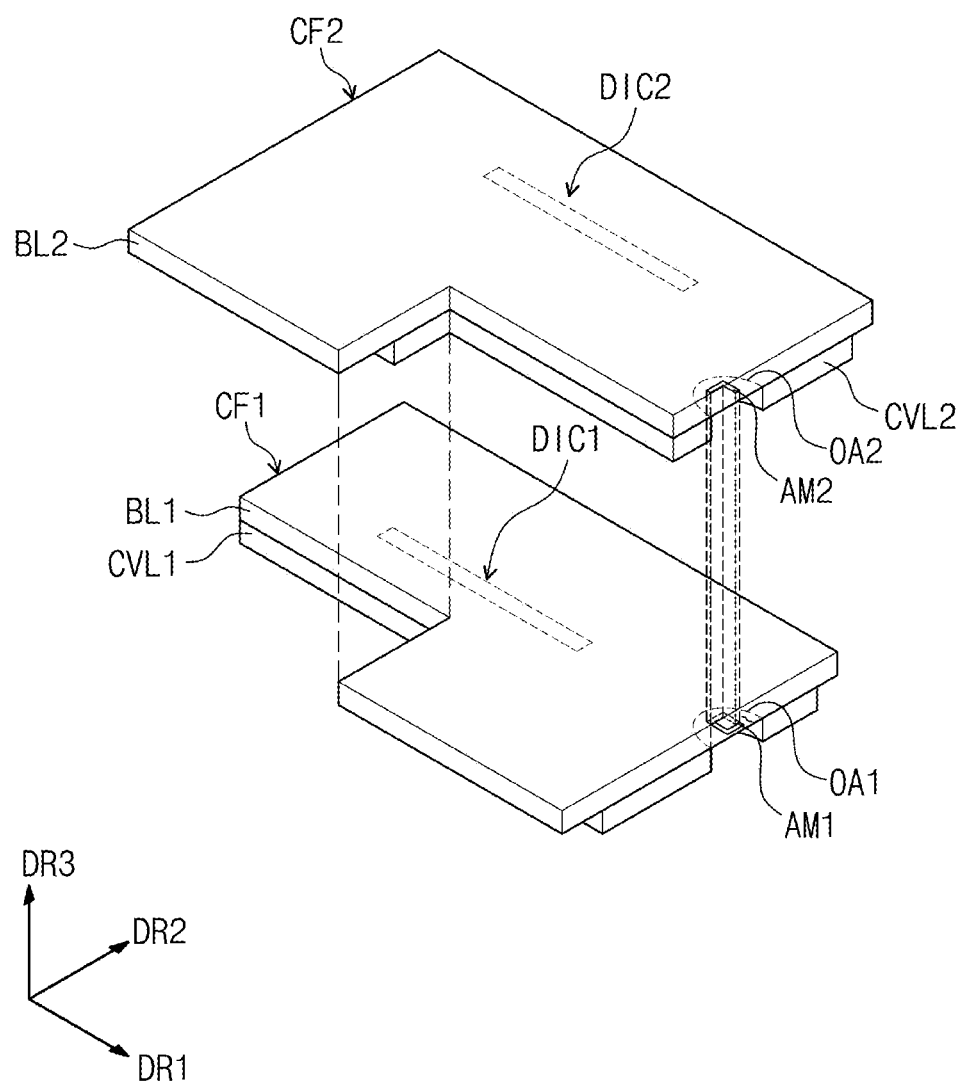
FIG. 6 is a perspective view showing a first flexible circuit film and a second flexible circuit film according to an embodiment of the present disclosure.

FIG. 6 is a perspective view showing the first flexible circuit film CF1 and the second flexible circuit film CF2 according to an embodiment of the present disclosure.

Referring to FIGS. 3 and 6, the first flexible circuit film CF1 and the second flexible circuit film CF2 may overlap each other. In an embodiment, the second flexible circuit film CF2 overlaps the first flexible circuit film CF1 coupled to the first pad part PD1 of the display panel DP and may be coupled to the second pad part PD2 of the display panel DP. In this case, the first driving chip DIC1 of the first flexible circuit film CF1 and the second driving chip DIC2 of the second flexible circuit film CF2 may not overlap each other.

According to an example of the present disclosure, the first cover layer CVL1 of the first flexible circuit film CF1 may be provided with the first opening OA1, and the first alignment mark AM1 may be exposed through the first opening OA1 and may overlap the second alignment mark AM2. In addition, the second cover layer CVL2 of the second flexible circuit film CF2 may be provided with the second opening OA2, and the second alignment mark AM2 may be exposed through the second opening OA2 and may overlap the first alignment mark AM1. Accordingly, when the first flexible circuit film CF1 overlaps the second flexible circuit film CF2, it is possible to check whether the first alignment mark AM1, which is not covered by the first cover layer CVL1, is aligned with the second alignment mark AM2, which is not covered by the second cover layer CVL2, through the camera, for example. Accordingly, the first flexible circuit film CF1 and the second flexible circuit film CF2 may be aligned with each other while being coupled to the display panel DP.

Figure 7:
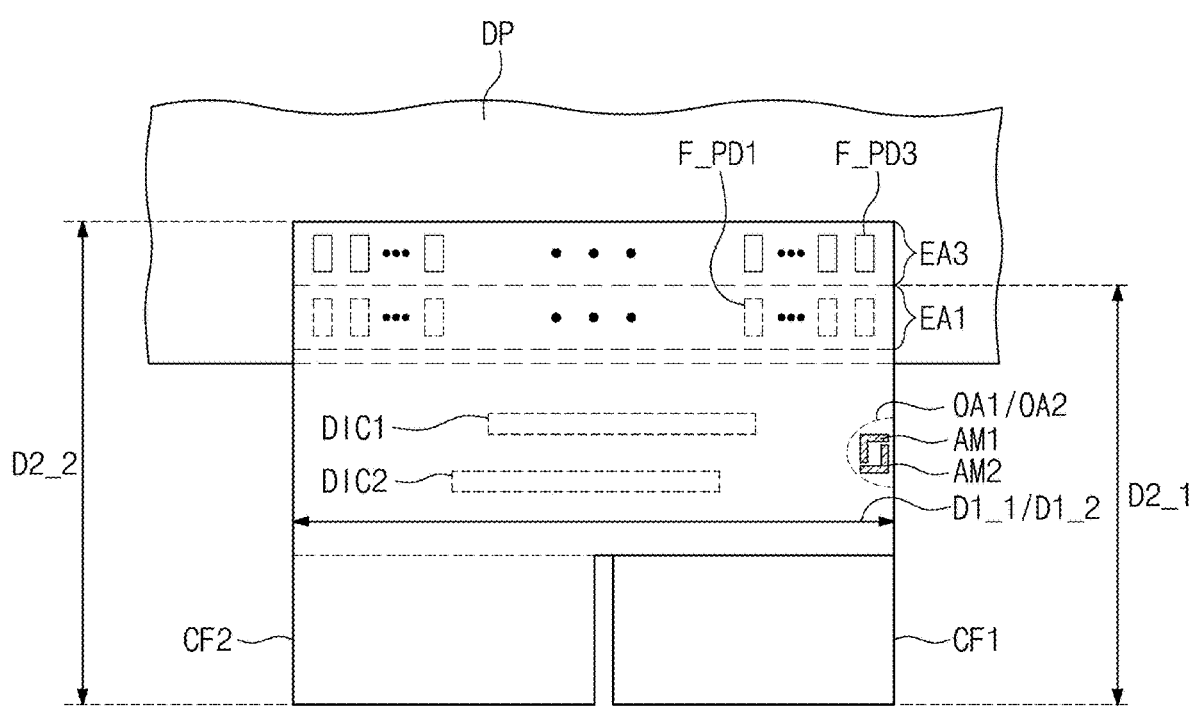
FIG. 7 is a plan view showing a first flexible circuit film and a second flexible circuit film according to an embodiment of the present disclosure.

FIG. 7 is a plan view showing the first flexible circuit film CF1 and the second flexible circuit film CF2 according to an embodiment of the present disclosure.

Referring to FIGS. 6 and 7, according to an embodiment, the first opening OA1 of the first flexible circuit film CF1 may be formed by recessing one side surface of the first cover layer CVL1. However, the present disclosure is not limited thereto or thereby. In an embodiment, the first opening OA1 may be formed to be spaced apart from the one side surface of the first cover layer CVL1. In other words, the first opening OA1 may be formed through a peripheral portion, which does not overlap the first driving chip DIC1 and the first conductive line CL1, rather than a center portion of the first cover layer CVL1. In an embodiment, the second opening OA2 of the second flexible circuit film CF2 may be formed by recessing one side surface of the second cover layer CVL2. However, the present disclosure is not limited thereto or thereby. In an embodiment, the second opening OA2 may be formed to be spaced apart from the one side surface of the second cover layer CVL2. In other words, the second opening OA2 may be formed through a peripheral portion, which does not overlap the second driving chip DIC2 and the second conductive line CL2, rather than a center portion of the second cover layer CVL2.

According to an embodiment of the present disclosure, the first and second openings OA1 and OA2 may not overlap the display panel DP. Alignment marks used to respectively couple the first and second pad parts PD1 and PD2 of the display panel DP to the first and second flexible circuit films CF1 and CF2 may be already disposed in portions in which the first and second flexible circuit films CF1 and CF2 overlap the display panel DP. Accordingly, when the first and second alignment marks AM1 and AM2 are disposed to be spaced apart from the alignment marks, the first flexible circuit film CF1 and the second flexible circuit film CF2 may be more precisely aligned with each other.

According to an embodiment of the present disclosure, a width D1_1 in the first direction DR1 of the first flexible circuit film CF1 may be the same as a width D1_2 in the first direction DR1 of the second flexible circuit film CF2. This is because the first and second alignment marks AM1 and AM2 are disposed in the first and second flexible circuit films CF1 and CF2 and the area of the second flexible circuit film CF2 does not need to be increased for the arrangement of additional alignment marks. When the width D1_1 in the first direction DR1 of the first flexible circuit film CF1 is the same as the width D1_2 in the first direction DR1 of the second flexible circuit film CF2, a gap between the flexible circuit films CF arranged in the first direction DR1 may be secured.

However, in an embodiment, a width D2_1 in the second direction DR2 of the first flexible circuit film CF1 may be smaller than a width D2_2 in the second direction DR2 of the second flexible circuit film CF2. The first flexible circuit film CF1 may be coupled to the first pad part PD1 of the display panel DP, and the second flexible circuit film CF2 may be coupled to the second pad part PD2 disposed between the first pad part PD1 and the pixel part PP (refer to FIG. 1) of the display panel DP.

Figure 8:
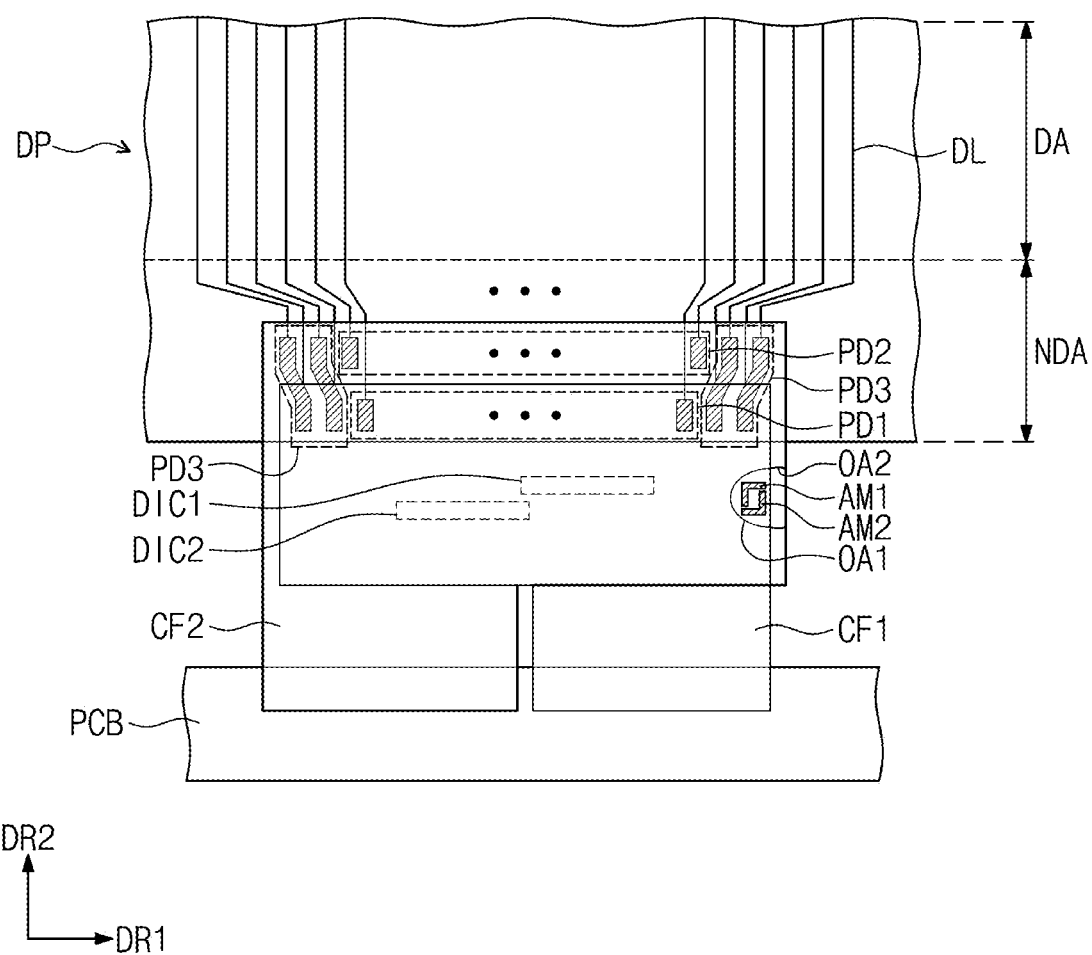
FIG. 8 is an enlarged plan view showing a portion of a display device according to an embodiment of the present disclosure.

FIG. 8 is an enlarged plan view showing a portion of a display device according to an embodiment of the present disclosure.

Referring to FIG. 8, a pad part PD of a display panel DP (refer to FIG. 2) may further include a third pad part PD3 electrically connected to first and second flexible circuit films CF1 and CF2. Accordingly, the first flexible circuit film CF1 may be coupled to a first pad part PD1 and the third pad part PD3 of the display panel DP, and the second flexible circuit film CF2 may be coupled to a second pad part PD2 and the third pad part PD3 of the display panel DP. That is, the third pad part PD3 may be commonly connected to the first and second flexible circuit films CF1 and CF2. The third pad part PD3 may be disposed to overlap the first and second flexible circuit films CF1 and CF2.

The first and second flexible circuit films CF1 and CF2 may be electrically connected to each other by the third pad part PD3 and may transmit and receive various control signals and a power signal to and from each other.

Figure 9:
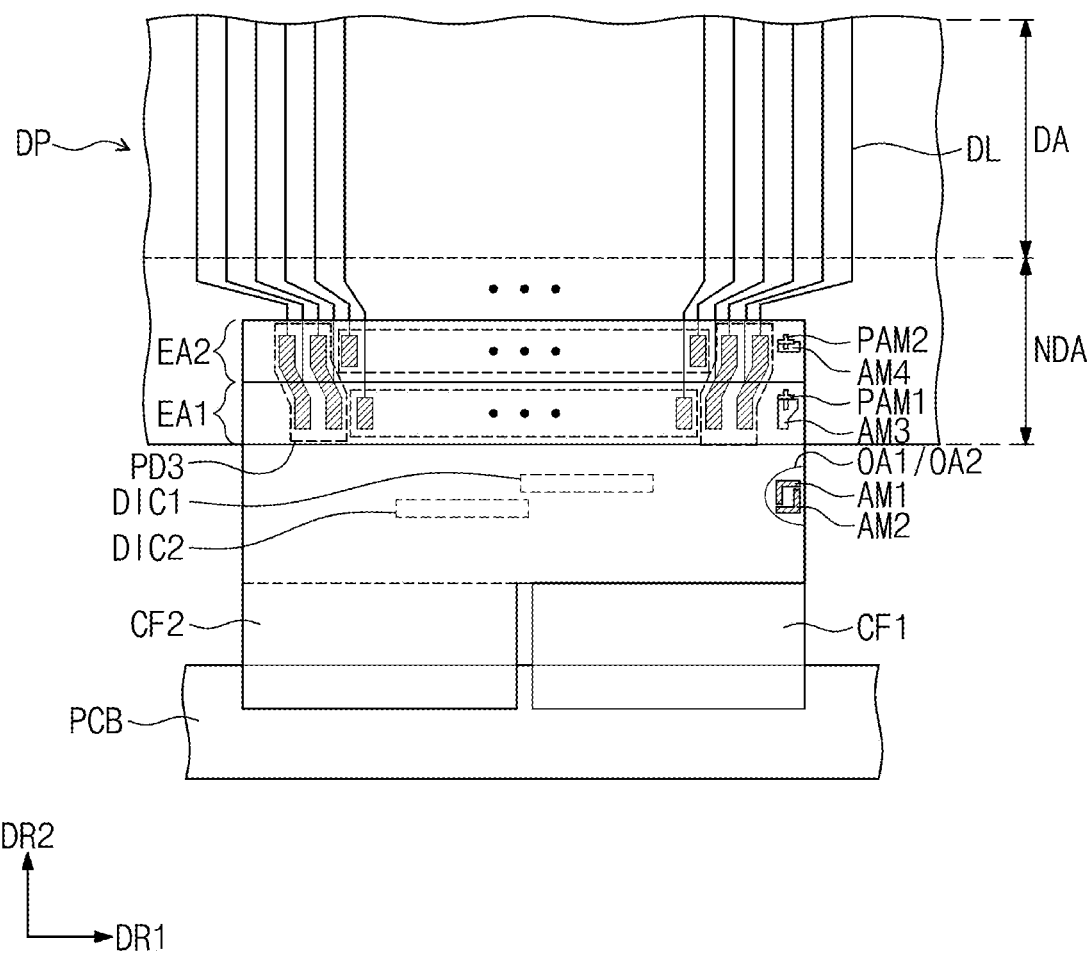
FIG. 9 is an enlarged plan view showing a portion of a display device according to an embodiment of the present disclosure.

FIG. 9 is an enlarged plan view showing a portion of a display device according to an embodiment of the present disclosure.

Referring to FIGS. 7 and 9, according to an embodiment of the present disclosure, a display panel DP may further include a first panel alignment mark PAM1 and a second panel alignment mark PAM2. In an embodiment, a first flexible circuit film CF1 may further include a third alignment mark AM3 aligned with the first panel alignment mark PAM1, and a second flexible circuit film CF2 may further include a fourth alignment mark AM4 aligned with the second panel alignment mark PAM2.

A first pad part PD1 (refer to FIG. 8) of the display panel DP and first conductive pads F_PD1 (refer to FIG. 7) of the first flexible circuit film CF1 may be aligned with each other using the first panel alignment mark PAM1 and the third alignment mark AM3. In addition, a second pad part PD2 (refer to FIG. 8) of the display panel DP and third conductive pads F_PD_3 (refer to FIG. 7) of the second flexible circuit film CF2 may be aligned with each other using the second panel alignment mark PAM2 and the fourth alignment mark AM4. Accordingly, the coupling reliability between the first pad part PD1 of the display panel DP and the first conductive pads F_PD1 of the first flexible circuit film CF1 may be improved. In addition, the coupling reliability between the second pad part PD2 of the display panel DP and the third conductive pads F_PD3 of the second flexible circuit film CF2 may be improved.

Figure 10:
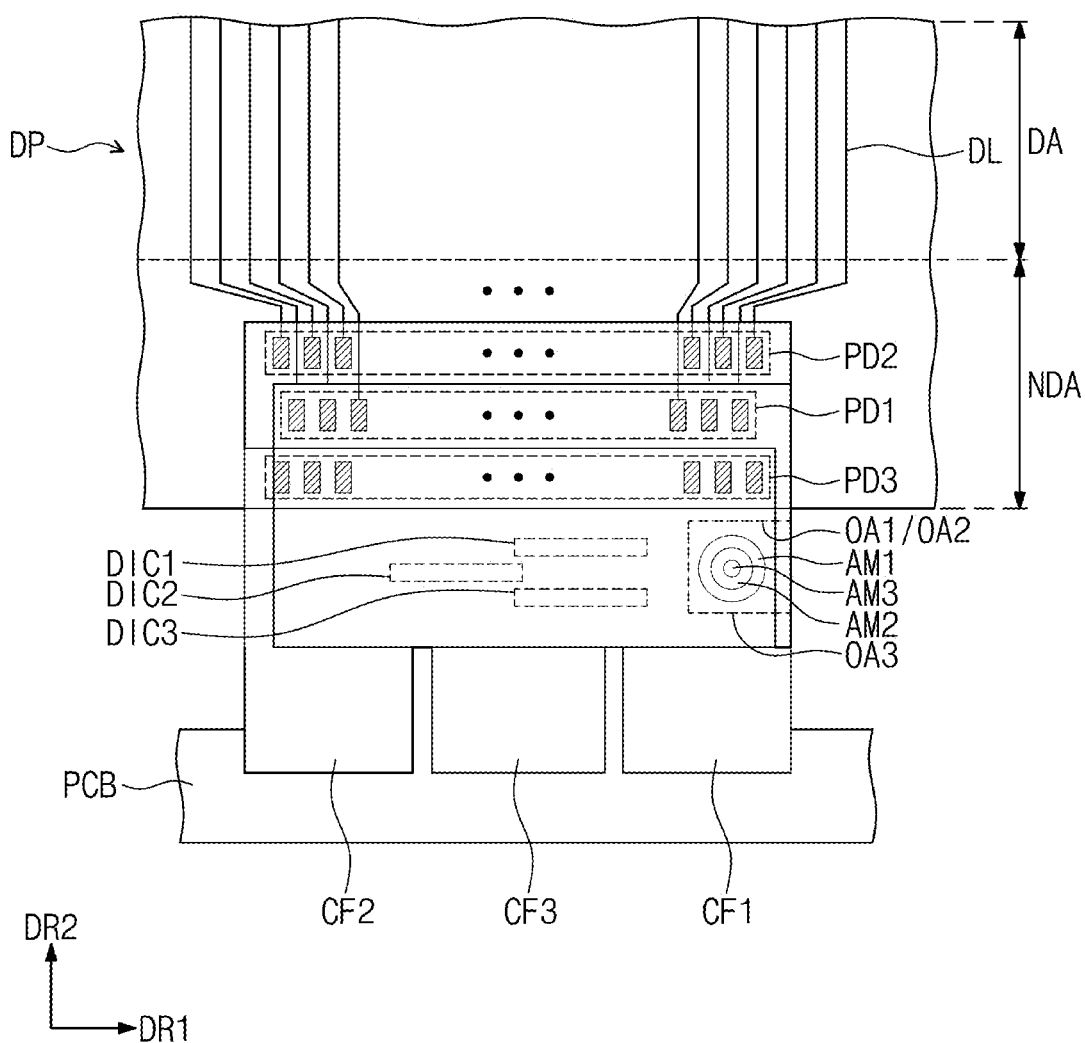
FIG. 10 is an enlarged plan view showing a portion of a display device according to an embodiment of the present disclosure.

FIG. 10 is an enlarged plan view showing a portion of a display device according to an embodiment of the present disclosure.

Referring to FIG. 10, the display device DD may further include a third flexible circuit film CF3 coupled to a pad part PD (refer to FIG. 2) and overlapping first and second flexible circuit films CF1 and CF2. The third flexible circuit film CF3 may include a third alignment mark AM3 aligned with first and second alignment marks AM1 and AM2. As an example, the pad part PD may further include a third pad part PD3 in addition to a first pad part PD1 and a second pad part PD2. The first pad part PD1 may be disposed between the third pad part PD3 and a pixel part PP, and the second pad part PD2 may be disposed between the first pad part PD1 and the pixel part PP. As another example, the third pad part PD3 may be disposed between the first pad part PD1 and the second pad part PD2.

The third flexible circuit film CF3 may include a third base film, a third conductive line electrically connected to the third base film, and a third cover layer covering the third conductive line. The third cover layer of the third flexible circuit film CF3 may further include a third opening OA3 defined therethrough.

A first opening OA1 of the first flexible circuit film CF1 may be formed in an area overlapping the third alignment mark AM3, and a second opening OA2 of the second flexible circuit film CF2 may be formed in an area overlapping the third alignment mark AM3. The third alignment mark AM3 of the third flexible circuit film CF3 may be disposed on the third base film, and the third alignment mark AM3 may be exposed through the third opening OA3. In addition, the third opening OA3 may be formed in an area overlapping the first and second alignment marks AM1 and AM2.

A third driving chip DIC3 may be mounted on the third flexible circuit film CF3. The third driving chip DIC3 may be disposed between one end and the other end of the third flexible circuit film CF3. As an example, the first driving chip DIC1, the second driving chip DIC2 and the third driving chip DIC3 may not overlap each other in a plane.

Although some embodiments of the present disclosure have been described, it is to be understood that the present disclosure should not be limited to these embodiments, but various changes and modifications can be made by one of ordinary skill in the art within the spirit and scope of the present disclosure as herein claimed. Therefore, the disclosed subject matter should not be limited to any single embodiment described herein, and the scope of the present inventive concept shall be determined according to the claims.

What is claimed is:

1. A display device comprising:
   a display panel comprising a pixel part to display an image, and a pad part connected to the pixel part;
   a first flexible circuit film coupled to the pad part and comprising a first alignment mark; and
   a second flexible circuit film coupled to the pad part, overlapping the first flexible circuit film along a thickness direction of the display panel, and comprising a second alignment mark aligned with the first alignment mark, wherein, in a plan view as viewed along the thickness direction, the first alignment mark overlaps the second flexible circuit film and the second alignment mark overlaps the first flexible circuit film.

2. The display device of claim 1, wherein the pad part comprises:
   a first pad part; and
   a second pad part between the pixel part and the first pad part, the first flexible circuit film is coupled to the first pad part, and the second flexible circuit film is coupled to the second pad part.

3. The display device of claim 2, wherein the pad part further comprises a third pad part electrically connected to the first and second flexible circuit films.

4. The display device of claim 2, wherein the first pad part extends in a first direction, and the second pad part extends in the first direction and is spaced apart from the first pad part in a second direction different from the first direction.

5. The display device of claim 4, wherein a width in the first direction of the first flexible circuit film is the same as a width in the first direction of the second flexible circuit film.

6. The display device of claim 5, wherein a width in the second direction of the first flexible circuit film is smaller than a width in the second direction of the second flexible circuit film.

7. The display device of claim 2, wherein the first flexible circuit film comprises:
   a first base film;
   a first conductive line on the first base film and electrically connected to the first pad part; and
   a first cover layer covering the first conductive line and comprising a first opening defined therethrough, and the second flexible circuit film comprises:
   a second base film;
   a second conductive line on the second base film and electrically connected to the second pad part; and
   a second cover layer covering the second conductive line and comprising a second opening defined therethrough.

8. The display device of claim 7, wherein the first alignment mark is located on the first base film and exposed through the first opening, and the second alignment mark is located on the second base film and exposed through the second opening.

9. The display device of claim 8, wherein the first alignment mark is located on a same layer as the first conductive line, and the second alignment mark is located on a same layer as the second conductive line.

10. The display device of claim 8, wherein the first opening overlaps the second alignment mark, and the second opening overlaps the first alignment mark.

11. The display device of claim 10, wherein the first opening is defined by a recessed side surface of the first cover layer, and the second opening is defined by a recessed side surface of the second cover layer.

12. The display device of claim 8, wherein the first and second openings do not overlap the display panel.

13. The display device of claim 1, further comprising:
   a first driving chip mounted on the first flexible circuit film; and
   a second driving chip mounted on the second flexible circuit film.

14. The display device of claim 13, wherein the first driving chip does not overlap the second driving chip.

15. The display device of claim 1, wherein the display panel further comprises a first panel alignment mark and a second panel alignment mark, the first flexible circuit film further comprises a third alignment mark aligned with the first panel alignment mark, and the second flexible circuit film further comprises a fourth alignment mark aligned with the second panel alignment mark.

16. A display device comprising:
   a display panel comprising a pixel part to display an image, and a pad part connected to the pixel part;
   a first flexible circuit film coupled to the pad part and comprising a first alignment mark:
   a second flexible circuit film coupled to the pad part, overlapping the first flexible circuit film, and comprising a second alignment mark aligned with the first alignment mark, wherein the first and second alignment marks are located in an area where the first flexible circuit film overlaps the second flexible circuit film; and
   a third flexible circuit film coupled to the pad part, overlapping the first and second flexible circuit films, and comprising a third alignment mark aligned with the first and second alignment marks, wherein the third alignment mark is located in an area where the first, second, and third flexible circuit films overlap each other.

17. A display device comprising:
   a display panel comprising a pixel part to display an image, a first pad part connected to the pixel part, and a second pad part connected to the pixel part and located between the first pad part and the pixel part;
   a first flexible circuit film coupled to the first pad part and comprising a first alignment mark; and
   a second flexible circuit film coupled to the second pad part, overlapping the first flexible circuit film along a thickness direction of the display panel, and comprising a second alignment mark aligned with the first alignment mark, wherein, in a plan view as viewed along the thickness direction, the first alignment mark overlaps the second flexible circuit film, the second alignment mark overlaps the first flexible circuit film, and the first and second alignment marks do not overlap the display panel.

18. The display device of claim 17, wherein the first flexible circuit film comprises:
   a first base film;
   a first conductive line on the first base film and electrically connected to the first pad part; and
   a first cover layer covering the first conductive line and comprising a first opening defined therethrough, and the second flexible circuit film comprises:
   a second base film;
   a second conductive line on the second base film and electrically connected to the second pad part; and
   a second cover layer covering the second conductive line and comprising a second opening defined therethrough.

19. The display device of claim 18, wherein the first alignment mark is located on the first base film and exposed through the first opening, and the second alignment mark is located on the second base film and exposed through the second opening.

20. The display device of claim 19, wherein the first opening overlaps the second alignment mark, and the second opening overlaps the first alignment mark.

* * * * *